Nov. 29, 1955 W. M. WEBSTER, JR., ET AL 2,725,505
SEMICONDUCTOR POWER DEVICES
Filed Nov. 30, 1953
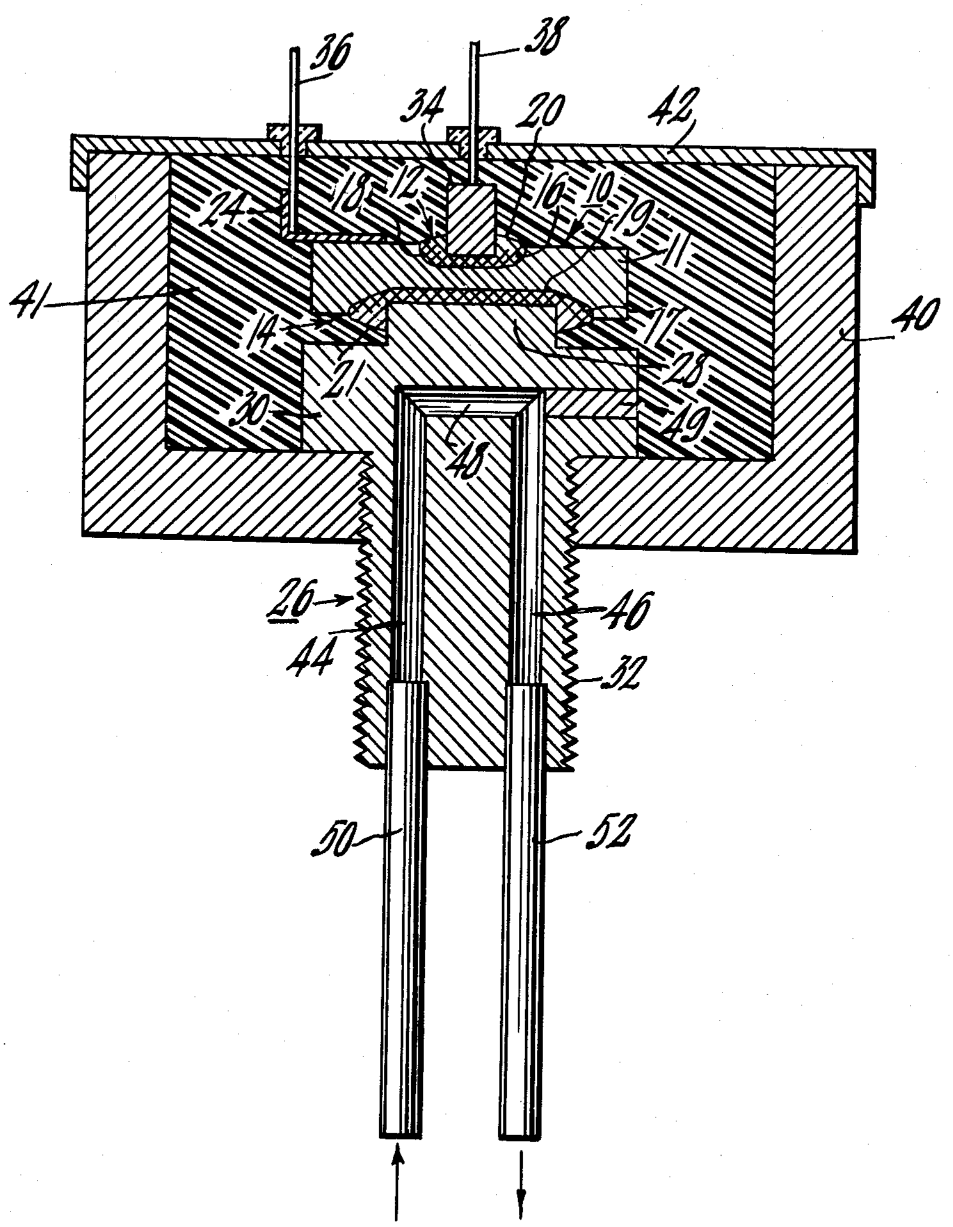
INVENTORS
WILLIAM M. WEBSTER, JR.
& JOHN R. WOOLSTON
BY J. L. Whittaker
ATTORNEY 2,725,505

SEMICONDUCTOR POWER DEVICES

William M. Webster, Jr., Princeton, and John R. Woolston, Trenton, N. J., assignors to Radio Corporation of America, a corporation of Delaware Application November 30, 1953, Serial No. 395,016

13 Claims. (Cl. 317—235)

This invention relates to semiconductor devices and to methods of preparing them and particularly to an improved construction for P-N junction-type semiconductor devices used in power applications.

A typical P-N junction-type semiconductor device comprises a body of semiconductor material of one type of conductivity having one or more P-N junctions formed therein. The P-N junctions comprise zones of N-type and P-type conductivity material separated by rectifying barriers which have high resistance to electrical current flow in one direction and low resistance to such flow in the reverse direction.

One type of semiconductor device to which the principles of the invention apply is known as a transistor, and may include a body of semiconductor material of one type of conductivity having two P-N junctions with the various regions of the device arranged in P-N-P or N-P-N order. Transistors may be prepared in at least two ways. According to one method, the zones of different types of conductivity and the P-N junctions are formed by a crystal growing process whereby a crystal is drawn from molten semiconductor material to which selected impurity materials are added in a predetermined order.

According to another method, known as the alloying or fusion method, two pellets of impurity material capable of producing semiconductor material of one conductivity type are positioned on opposite surfaces of a semiconductor crystal of the opposite conductivity type. This assembly is heated to cause the impurity material and semiconductor material to melt and dissolve in each other. After a predetermined heating period, the assembly is allowed to cool and upon cooling, the molten material recrystallizes to form a P-N rectifying junction beneath each surface of the crystal. Adjacent to each P-N junction and protruding above each surface, the recrystallized material comprises an alloy of the impurity material and the semiconductor material which alloy does not have semiconductor properties.

In such transistor devices, one of the two outer regions of the same type of conductivity is operated as the emitter electrode and the other region is operated as the collector electrode. An ohmic, non-rectifying contact electrode is bonded to the third or middle region which constitutes the base region of the device. In operation of such devices, under the control of an input signal applied to either the emitter or base electrode, the emitter electrode injects minority charge carriers into the base region. These carriers are collected by the collector electrode which is the output electrode of the device and to which a suitable output circuit is connected.

As occurs in conventional electronic devices, the passage or flow of electrical charges in semiconductor devices, such as transistors, produces heating of the devices. The problem of dissipation of the generated heat is particularly important in the operation of transistors required to handle considerable amounts of power since a transistor may be destroyed by excessive heating.

Heretofore, one solution of the problem of heat dissipation has been to immerse the semiconductor device in a metallic container filled with an oil or other liquid. However, the conventional oils generally utilized for such a purpose have been unsatisfactory because they do not provide adequate heat dissipation and because they often impair the device itself by adversely affecting the surface of the semiconductor crystal.

Another solution, in the case of the alloyed transistor, has been to bond heat radiators to the crystal and/or to one or both of the alloy regions adjacent to each P-N junction in the crystal. However, the use of heat radiators does not always produce the degree of heat dissipation required in power transistors.

Accordingly, an important object of this invention is to provide an improved semiconductor device suitable for power operation.

Another object is to improve heat dissipation in semiconductor devices.

Still another object of the invention is to provide an improved P-N junction-type semiconductor device having good heat dissipation characteristics and improved operational characteristics.

A further object of the invention is to provide an improved method of mounting a transistor to obtain improved cooling.

A still further object is to provide an improved method of making electrical connection between a portion of a transistor and a metal heat radiator.

In general, the objects and advantages of this invention are accomplished in a P-N-P or N-P-N alloy junction transistor by introducing one or more rods or studs as efficient heat conducting members into the alloy material adjacent to each outer region and positioning these rods to penetrate into close proximity with the P-N junction associated therewith. The portions of the rods remaining outside of the N or P regions may have large-area heat radiators connected thereto. In addition, forced fluid cooling means may be provided within the studs or radiators.

The invention is described in greater detail by reference to the accompanying drawing, the single figure of which is a sectional, elevational view of a power transistor prepared in accordance with the present invention.

The principles of this invention are particularly applicable to P-N junction type semiconductor devices or transistors and, particularly, to transistors prepared by an alloying or fusion process. Referring to the drawing, a typical transistor 10 comprises a crystal or wafer 11 of semiconductor material of germanium, silicon or the like of N-type or P-type conductivity. For the purposes of this description, the crystal 11 will be assumed to be N-type germanium. The wafer or body 11 is provided with a P-N junction-type emitter electrode 12 and P-N junction-type collector electrode 14. When prepared by an alloying technique to be described below, the electrodes 12 and 14 include regions 16 and 17 of a type of conductivity opposite to that of the N-type semiconductor body 11, the electrodes in this case being of P-type material, separated from the body by rectifying barriers 18 and 19 respectively. Portions 20 and 21 adjacent to the regions 16 and 17 comprise alloys of the germanium of the body 10 and the impurity material employed in forming the P-N junctions. These alloy portions 20 and 21 are metallic and do not have semiconductor properties.

The emitter and collector electrodes 12 and 14 are preferably formed in opposite surfaces of the crystal or wafer 11 and are preferably concentrically aligned. The collector electrode 14 may be made larger than the emitter electrode 12 according to the teaching of J. I. Pankove in his copending U. S. patent application, Serial Number 293,330, filed June 13, 1952, and assigned to the assignee of this application.

One satisfactory method for forming the P-N junction electrodes 12 and 14 is described in a copending U. S. patent application of Charles W. Mueller, Serial Number 295,304, filed June 24, 1952, and assigned to the assignee of this application and in an article by Law et al. entitled "A Developmental Germanium P-N-P Junction Transistor" in the November 1952 Proceedings of the I. R. E. According to the method described in said application and publication, disks or pellets of a so-called impurity material are placed in contact with opposite surfaces of the block 11 of semiconductor material. The assembly of block and pellets is heated in an atmosphere of hydrogen, or an inert gas such as argon, at a temperature sufficient to cause the pellets to melt and alloy with the semiconductor block to form the desired junction electrodes. If the body of the device comprises N-type semiconductor material, then any one of indium, gallium, aluminum, zinc or boron, for example, may be used as the impurity alloying material. If the semiconductor body is of P-type material, then any one of phosphorus, arsenic, sulfur, selenium, tellurium, antimony or bismuth, for example, may be used as the impurity alloying material. After the alloying operation, the device is etched in conventional fashion, for example, as described in the Mueller application.

A base electrode 24 is bonded in ohmic contact to the body 11 at any convenient location, for example, at one end thereof. The base electrode 24 may comprise a metal tab or plate of nickel or the like.

Next, electrical connection is made to the collector electrode 14 and, according to the invention, the connection also comprises a means for conducting away from the collector junction or barrier heat generated during the operation of the transistor. It has been discovered that the greater portion of the heat generated within a transistor appears in the vicinity of the P-N junction associated with the collector electrode. It has also been discovered that semiconductor materials and certain alloys thereof are comparatively poor heat conductors. Therefore, according to the invention, the transistor is mounted by means of the collector electrode 14 on a heat conductor 26 of copper, nickel or the like. The heat radiator or dissipator 26 comprises a cylindrical member having a stud 28 at one end and an enlarged disk-like portion 30 adjacent thereto which acts as a heat radiator and conductor and which is provided with a threaded extension 32 for a purpose to be described below.

The stud 28 is embedded within the alloy material 21 adjacent to the collector P-N junction barrier 19 and as close to the barrier as possible. It is desirable that the portion of the stud 28 within the alloy material 21 have a cross-sectional area comparable to that of the effective area of the barrier 19. According to one method of embedding the stud within the region 21, the transistor is positioned on the stud with the region 21 in contact with it. The stud is then heated by any suitable means, for example, a soldering iron, to a temperature of the order of 150° C. which is sufficient to soften the alloy material without melting the P-type or N-type germanium or adversely affecting the junction itself. When the alloy material has been sufficiently softened, the stud is pressed as far as possible into the softened material at which time it is in contact with the thin P-type region 17 and in close proximity to the barrier 19. The molten material of the region 21 clings to the stud by surface tension and forms a strong and intimate bond therewith.

In some instances where the region 17 is excessively large, it may be desirable to slice away a portion of it before attaching the stud 28 thereto. In addition, it may be desirable, in some instances to first coat the stud with a low melting point solder such as Cerrobend which is an alloy of 50% bismuth, 26.7% lead, 13.3% tin and 10% cadmium. Since the solder material melts at a comparatively low temperature and the large area stud is a good heat conductor, the soldering connection is made, again without excessive heating of the collector P-N junction.

If desired, a rod or stud 34 may be similarly mounted within the alloy material 20 associated with the emitter P-N junction 12 thus providing electrical connection thereto and a degree of heat conduction therefrom. Electrode leads 36, 38 are spot welded or otherwise connected to the base tab 24 and the emitter electrode stud 34, respectively.

Finally, the heat dissipator 26 is threaded on a large area cup-type metallic heat radiator 40 by means of the threaded portion 32. The transistor thus constructed may then be mounted on a chassis by means of the portion 32 if the proper electrical relationship is maintained. If desired, the cup 40 may be filled with a potting material 41, for example, one of the materials selected from a sub-class of resins which are manufactured by Ciba Company, Inc. under the trademark "Araldite." The mechanical and chemical properties of Araldite have been described, for example, in a paper by Preiswerk, Meyerhans and Denz, which appears in "Materials and Methods" October, 1949, and by Preiswerk and Meyerhans in "Electrical Manufacturing" July, 1949. Further information on the chemical composition of Araldite will be found in a paper by Ott which appears in "Schweizer Archiv" January, 1949, pages 23–31 (a translation of this paper has been published by the Technical Service Department, Aero Research Limited, Duxford, Cambridge, England, which is entitled "Aero Research Technical Notes," Bulletin No. 75, March 1949). In this connection reference is made to the Patents 2,324,483 and 2,444,333 to Castan which disclose examples of Araldite resins.

Suitable Araldite resins for use in this invention are of the ethoxylene class of materials and are condensation products of polyaryl-ethylene oxide compounds with acid anhydrides, amines and other compounds. All of these materials harden to form solid materials without evolution of water or other volatile substances. A particular preferred example for use in the present invention has the designation Araldite CN502.

After the cup 40 has been filled with the resin 41, a cap 42 of metal or the like may be soldered or otherwise bonded to the cup to seal the device. If the cap is of metal, the leads 36 and 38 must be insulated therefrom as by a quantity of the potting resin.

To provide still further cooling of the transistor, the heat dissipator 26 may be provided with a conduit through which a fluid cooling means, a gas or a liquid, may be passed during operation of the device. Such a conduit may be provided by drilling two longitudinal channels 44 and 46 in the portion 32 and one transverse channel 48 in the portion 30 so arranged that they form a continuous path, indicated by arrows, into and out of the radiator. A portion of channel 38 is obstructed as by a metal filling 49. Lengths of tubing 50 and 52 are soldered or otherwise bonded to the channels 44 and 46 respectively to provide access thereto from an external fluid source (not shown).

What is claimed is:

1. A semiconductor device comprising a body of semiconductor material having therein zones of different conductivity types separated by a rectifying barrier, a quantity of metal integral with at least one of said zones, and a heat dissipating member penetrating into said metal and into close proximity to said barrier.

2. A semiconductor device comprising a body of semiconductor material having therein zones of different conductivity types separated by a rectifying barrier, a quantity of metal adjacent to and integral with one of said zones, and a heat dissipating member penetrating into said metal and into close proximity to said barrier, the portion of said member within said metal having a cross-sectional area approximating the area of said barrier.

3. A semiconductor device comprising a body of semiconductor material having therein zones of different conductivity types separated by a rectifying barrier, a layer of metal adjacent to and integral with one of said zones, a heat conducting member penetrating into said metal and extending close to said rectifying barrier, and a heat radiating member connected to said heat conducting member.

4. A semiconductor device comprising a body of semiconductor material having therein zones of different conductivity types separated by a rectifying barrier, a region of metal connected to one of said zones, a heat conducting member penetrating into said region and extending close to said rectifying barrier, and a cup-shaped heat radiating fin connected to said member.

5. A semiconductor device comprising a body of semiconductor material having therein zones of different conductivity types separated by a rectifying barrier, a region of metal connected to one of said zones, a heat conducting member penetrating into said region and extending close to said rectifying barrier, a cup-shaped heat radiating fin connected to said member and an insulating potting material filling said cup and embedding said body.

6. A semiconductor device comprising a body of semiconductor material having therein zones of different conductivity types separated by a rectifying barrier, a region of metal adjacent to and integral with one of said zones, a heat conducting member penetrating into said region into close proximity to said barrier, and fluid cooling means connected to said heat conducting member.

7. A semiconductor device comprising a body of semiconductor material having therein zones of different conductivity types separated by a rectifying barrier, a region of metal adjacent to and integral with one of said zones, a heat conducting member penetrating into said region into close proximity to said barrier, and fluid cooling means connected to said heat conducting member.

8. A semiconductor device comprising a body of semiconductor material of one type of conductivity, a thin region in said body of another type of conductivity, a rectifying barrier between said body and said region, a metal region adjacent to and integral with said thin region, and a heat dissipating member penetrating into said metal region into close proximity to said thin region and said barrier.

9. A semiconductor device comprising a body of semiconductor material, a collector P-N junction within one surface of said body, an emitter P-N junction within another surface of said body, a region of a metallic alloy of said semiconductor material adjacent to and integral with a portion of said emitter P-N junction, and a heat dissipating member penetrating into one of said regions into close proximity with one of said P-N junctions.

10. A semiconductor device comprising a body of semiconductor material, a collector P-N junction within one surface of said body, an emitter P-N junction within another surface of said body, a region of a metallic alloy of said semiconductor material adjacent to and integral with a portion of said emitter P-N junction, and a heat dissipating member penetrating into one of said regions into close proximity with one of said collector P-N junctions.

11. A semiconductor device comprising a body of semiconductor material, a collector P-N junction within one surface of said body, an emitter P-N junction within another surface of said body, a region of a metallic alloy of said semiconductor material adjacent to and integral with a portion of said emitter P-N junction, and a heat dissipating member penetrating into one of said regions into close proximity with one of said collector P-N junctions, the cross-sectional area of said member within said region being comparable to the effective cross-sectional area of said P-N junction.

12. A semiconductor device comprising a body of semiconductor material, a collector P-N junction within one surface of said body, an emitter P-N junction within another surface of said body, a region of a metallic alloy of said semiconductor material adjacent to and integral with a portion of said collector P-N junction, and a heat dissipating member penetrating into each of said regions into close proximity to said P-N junctions.

13. A semiconductor device comprising a body of semiconductor material, a rectifying electrode in contact with said body and separated therefrom by a rectifying barrier, and a heat dissipating member penetrating said electrode and having a portion closely adjacent to said rectifying barrier.

References Cited in the file of this patent

UNITED STATES PATENTS

| | | |
|---|---|---|
| 2,644,852 | Dunlap | July 7, 1953 |
| 2,665,399 | Lingel | Jan. 5, 1954 |